US011316583B2

(12) United States Patent
Li et al.

(10) Patent No.: US 11,316,583 B2
(45) Date of Patent: Apr. 26, 2022

(54) PREDISTORTER, PREDISTORTER CONTROLLER, AND HIGH POWER AMPLIFIER LINEARIZATION METHOD

(71) Applicant: INTELLIGENT FUSION TECHNOLOGY, INC., Germantown, MD (US)

(72) Inventors: Lun Li, Germantown, MD (US); Jingyang Lu, Germantown, MD (US); John Nguyen, Germantown, MD (US); Dan Shen, Germantown, MD (US); Khanh Pham, Kirtland AFB, NM (US); Genshe Chen, Germantown, MD (US)

(73) Assignee: INTELLIGENT FUSION TECHNOLOGY, INC., Germantown, MD (US)

( * ) Notice: Subject to any disclaimer, the term of this patent is extended or adjusted under 35 U.S.C. 154(b) by 258 days.

(21) Appl. No.: 16/707,927

(22) Filed: Dec. 9, 2019

(65) Prior Publication Data

US 2021/0175962 A1 Jun. 10, 2021

(51) Int. Cl.
*H04B 7/15* (2006.01)
*H04L 25/03* (2006.01)
(Continued)

(52) U.S. Cl.
CPC ......... *H04B 7/18519* (2013.01); *G06N 20/00* (2019.01); *H03F 3/189* (2013.01); *H04B 7/18513* (2013.01); *H03F 2200/451* (2013.01)

(58) Field of Classification Search
CPC .... H04B 7/18519; H04B 1/0475; H04B 7/15; H04B 7/18513; H04B 17/14; G06N 20/00; G06N 3/04; G06N 3/0454; H03F 1/3241; H03F 3/189; H03F 3/24; H03F 2200/451; H04L 25/03165; H04L 25/49;
(Continued)

(56) References Cited

U.S. PATENT DOCUMENTS

2003/0203717 A1* 10/2003 Chuprun ............ G06K 13/0825
455/12.1
2006/0056330 A1* 3/2006 Anderson ................ H04N 7/20
370/316
(Continued)

*Primary Examiner* — Edan Orgad
*Assistant Examiner* — Vanneilian Lalchinthang
(74) *Attorney, Agent, or Firm* — Anova Law Group, PLLC

(57) ABSTRACT

The present disclosure provides a high power amplifier (HPA) linearization method, applied to a ground hub which includes a predistorter and a PD controller. The ground hub is arranged in a satellite communication system together with a transmitter and a satellite transponder, and the satellite transponder includes an HPA. The HPA linearization method includes determining an initial correction signal based on a physical model with a plurality of PD parameters to compensate AM-AM and AM-PM characteristics of the HPA; receiving a signal from the satellite transponder; determining a reward function for an action taken by the PD controller; examining an action-value function for actions taken in a preset past period; taking an action to adjust the plurality of PD parameters for the PD to generate an updated correction signal; sending the update correction signal to the transmitter to compensate the AM-AM and AM-PM characteristics of the HPA.

16 Claims, 12 Drawing Sheets

(51) Int. Cl.
*H04B 1/04* (2006.01)
*G05B 13/02* (2006.01)
*H04B 7/185* (2006.01)
*H03F 3/189* (2006.01)
*G06N 20/00* (2019.01)

(58) Field of Classification Search
CPC ............ G05B 13/0265; G05B 19/0423; G05B 2219/25257
USPC ......................................................... 370/316
See application file for complete search history.

(56) References Cited

U.S. PATENT DOCUMENTS

| | | | | |
|---|---|---|---|---|
| 2013/0040587 | A1* | 2/2013 | Ishikawa | H03F 1/3241 |
| | | | | 455/114.2 |
| 2015/0311927 | A1* | 10/2015 | Beidas | H03F 1/3241 |
| | | | | 375/296 |
| 2016/0277047 | A1* | 9/2016 | Deckman | H03F 1/3241 |
| 2019/0227502 | A1* | 7/2019 | Nakamura | G06N 20/00 |
| 2019/0317457 | A1* | 10/2019 | Shinoda | G05B 19/4063 |
| 2020/0186176 | A1* | 6/2020 | Chang | H04B 17/104 |
| 2020/0257252 | A1* | 8/2020 | Tsuneki | G05B 13/0265 |
| 2020/0295975 | A1* | 9/2020 | Li | H03F 3/20 |

\* cited by examiner

PREDISTORTER, PREDISTORTER CONTROLLER, AND HIGH POWER AMPLIFIER LINEARIZATION METHOD

GOVERNMENT RIGHTS

This invention was made with Government support under Contract No. FA9453-18-P-0233, awarded by the United States Air Force Research Laboratory. The U.S. Government has certain rights in this invention.

FIELD OF THE DISCLOSURE

The present disclosure generally relates to the field of satellite communication technology and, more particularly, relates to an on-ground physical-model based predistorter, a machine-learning based predistorter controller, and a high power amplifier linearization method.

BACKGROUND

In satellite communication (SATCOM) system, a simple "bent-pipe" transponder is widely adopted to convert uplink carrier frequencies to downlink carrier frequencies for transmission of information without having on-board processing capability. The transponders are equipped with high power amplifiers (HPAs), which like other amplifier modules in communication systems, cause nonlinear distortions to transmitted signals when HPAs are operated at or close to their saturation points to maximize power efficiency. These nonlinearities can be characterized as amplitude modulation-to-amplitude modulation (AM-AM), and amplitude modulation-to-phase modulation (AM-PM) effects, which degrade the transmission performance of the system.

In order to maximize the transponder throughput along with the HPA power efficiency, additional processing techniques have to be put in place. The predistortion (PD) is one of the most effective methods to compensate for HPA nonlinearities. The principle of the PD is to distort the HPA input signal by an additional device whose characteristics are the inverse of those of the amplifier. In the past, the predistortion technique employs look-up table (LUT) method, polynomial method, channel inversion method, etc. However, the presence of radio interferences brings challenges to SATCOM system.

To improve HPA's linearity for the bent-pipe transponder and reduce transponder's vulnerability to interference, the present disclosure provides a PD solution (e.g., a high power amplifier linearization method) for SATCOM to take the current and future satellite configurations, and practical implementation into account. According to the present disclosure, only on-ground modifications are needed in order to satisfy the low-cost demand. The PD solution adopts a physical-model based PD and a machine-learning based PD controller such that HPA linearity can be significantly improved in the presence of radio interference. In the physical-model based PD, the proposed solution accurately models the PD based on a carefully-selected HPA model and successfully identifies the PD parameters. The machine-learning based PD controller is deployed to deal with the impact of the external factors, such as equipment imperfections, temperature variation, interference signals, etc., and also feed an error-correction signal to the PD to adjust the parameters in a real-time fashion.

BRIEF SUMMARY OF THE DISCLOSURE

One aspect of the present disclosure provides a high power amplifier (HPA) linearization method, applied to a ground hub which includes a predistorter (PD) and a PD controller. The PD controller stores a database including a set of environmental parameters and a set of PD parameters corresponding to the set of environmental parameters. The ground hub is arranged in a SATCOM system together with a transmitter and a satellite transponder, and the satellite transponder includes an HPA. The HPA linearization method includes determining an initial correction signal including an AM-AM correction signal and an AM-PM correction signal based on a physical model with a plurality of PD parameters, and sending the initial correction signal to the transmitter to compensate AM-AM and AM-PM characteristics of the HPA; receiving a signal from the satellite transponder; determining a reward function for an action taken by the PD controller based on the received signal and environmental parameters; examining an action-value function for actions taken in a preset past period based on reward functions of the actions; taking an action, based on the environment parameters and the action-value function, to adjust the plurality of PD parameters for the PD to generate an updated correction signal; sending the update correction signal to the transmitter to compensate the AM-AM and AM-PM characteristics of the HPA; and updating the database in a real-time manner according to the environment parameters, the plurality of PD parameters, and the action-value function.

Another aspect of the present disclosure provides a PD disposed in a ground hub for HPA linearization. The ground hub is arranged in a SATCOM system together with a transmitter and a satellite transponder, and the satellite transponder includes an HPA. The PD includes a processor and a memory. The memory is configured to store computer-executable instructions. When the computer-executable instructions are executed, the processor is configured to determine an initial correction signal, including an AM-AM correction signal and an AM-PM correction signal, based on a physical model with a plurality of PD parameters, and send the initial correction signal to the transmitter to compensate AM-AM and AM-PM characteristics of the HPA; and in respond to the PD controller taking an action to adjust the plurality of PD parameters, generate an updated correction signal, and send the updated correction signal to the transmitter to compensate the AM-AM and AM-PM characteristics of the HPA.

Another aspect of the present disclosure provides a PD controller arranged in a ground hub. The ground hub further includes a PD and is arranged in a SATCOM system together with a transmitter and a satellite transponder, the satellite transponder includes an HPA, and the PD controller receives a signal from the satellite transponder. The PD controller includes a processor, a memory, and a data storage. The memory is configured to store computer-executable instructions, and the data storage is configured to store a database including a set of environmental parameters and a set of PD parameters corresponding to the set of environmental parameters. When the processor executes the computer-executable instructions, the PD controller determines a reward function for an action taken by the PD controller based on the received signal and environmental parameters; examine an action-value function for actions taken in a preset past period based on reward functions of the actions; take an action, based on the measured environment parameters and the action-value function, to adjust a plurality of PD parameters for the PD to generate an updated correction signal; and update the database, including the set of environmental parameters and the set of PD parameters, in a real-time manner according to the environment parameters, the plurality of PD parameters, and the action-value function.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
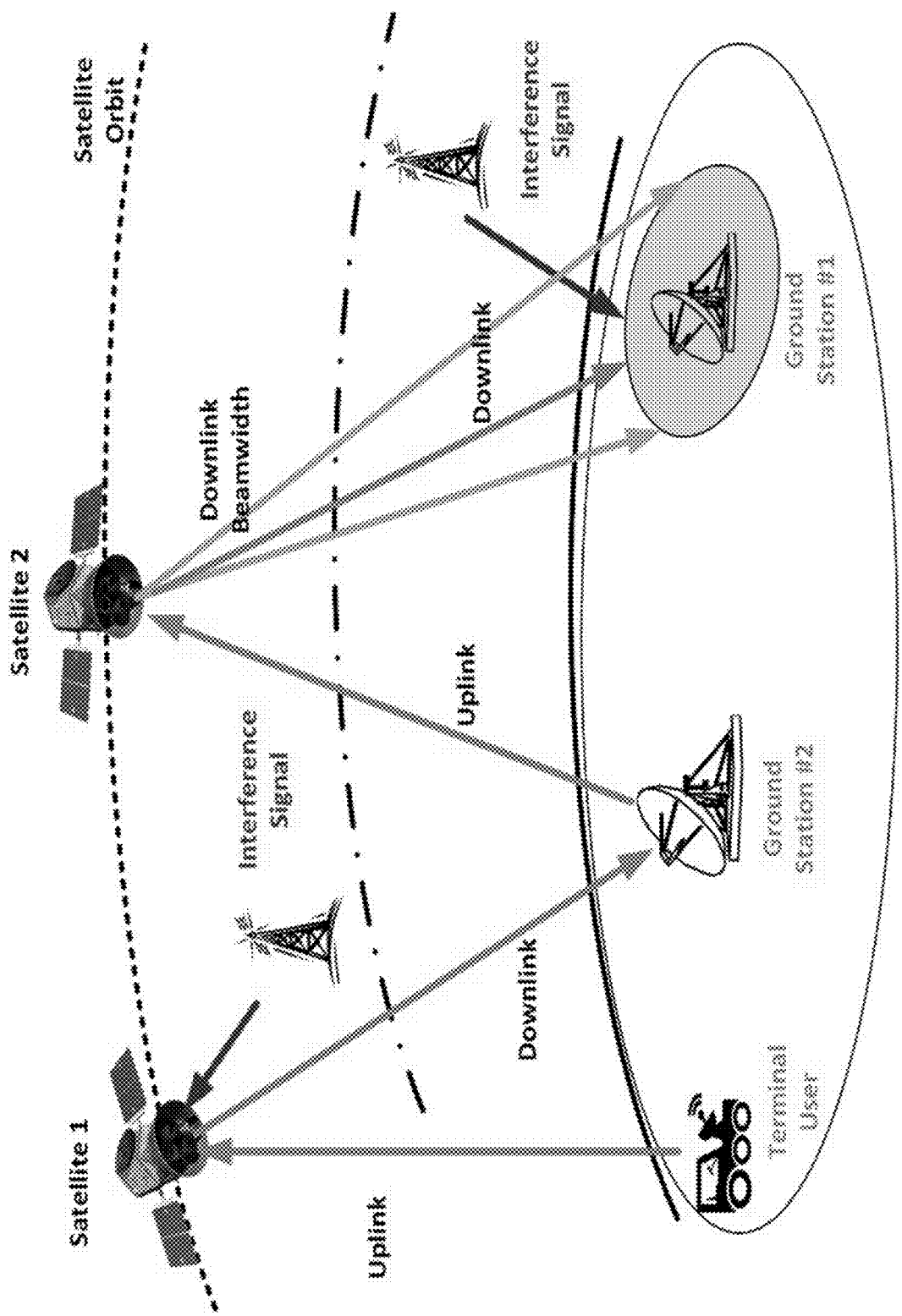
FIG. 1 illustrates a schematic diagram of a considered system concept of operations (CONOPS) according to various embodiments of the present disclosure.

FIG. 1 illustrates the considered system concept of operations (CONOPS) of the present disclosure. According to the CONOPS, ground users communicate with each other via satellite uplinks (U/L) and downlinks (D/L), and each satellite serves as a transmission relay node. According to the system model described above, the satellite D/L transmission signal may suffer from the AM-AM and AM-PM distortion effects when the HPA of the satellite is operated at the saturation point. In practice, to avoid the signal distortion caused by HPA nonlinearity, the HPA is normally set at 3 dB below its saturation point. However, because the U/L interference signal can adaptively push the input signal power of the HPA to its saturation point and cause the signal nonlinear distortion, the presence of the interference can bring a new challenge to the HPA linearization problem, since. As shown in FIG. 1, radio interference may affect the U/L transmission of Satellite 1. In order to design an effective PD solution in the presence of U/L interference, two practical cases may be considered. The first case is that the HPA is already set at its saturation, so that the interference does not cause AM-AM and AM-PM effects. For example, the HPA is assumed to remain static, and a well-designed physical-model based PD is capable of linearizing the HPA. The second case is that interference signal power causes the HPA to operate at saturation. In this scenario, the proposed machine learning algorithm may also be able to adjust the parameters of the PD. Except for the scenario discussed, the above scenario illustrates another instance when radio interference affects the D/L transmission signal, even though interference signal on the D/L does not cause AM-AM and AM-PM distortions. Although it is not the case of the interest of the present disclosure, it brings a new complicated problem to the PD controller in separating the U/L interference signals and D/L interference signals. It is worth to note that the machine learning technique according to the present disclosure is capable of taking optimal actions for the designed PD controller in all situations with different interference signals. However, this scenario is not the focus of the present disclosure.

To tackle the addressed nonlinear problems of HPAs in the presence of radio interference, the present disclosure provides a high power amplifier linearization method, an on-ground physical-model based PD, and a machine-learning based PD controller. According to various embodiments of the present disclosure, an affordable PD solution with only on-ground modifications may be adopted to achieve HPA linearization. As demonstrated in FIG. 2, this solution only requires modification of the configurations of the hub, and thus is able to achieve the low-cost goal. Meanwhile, the hybrid solution takes advantages of both the physical-model based PD and the machine learning technique to achieve HPA linearization, which is adaptive to different interference signals. This architecture includes two major modules: an on-ground physical-model based PD and a machine-learning based PD controller, respectively. When no AM-AM and AM-PM distortions are detected at the ground hub, the control channel to the transmitter stays idle. Once any nonlinear distortion is detected at the ground hub, the on-ground PD may send an error-correction signal to the transmitter via the control channel, such that HPA linearization can be achieved.

Specifically, corresponding to the considered CONOPS described above, the on-ground PD may be able to estimate and correct the AM-AM and AM-PM nonlinear distortions by itself when interference signals and other external factors are not the cause of distortion. When the U/L jammer or other external factors such as equipment imperfections and non-ambient temperature drives the HPA input power to the saturation point, the on-ground PD controller may use a machine learning model pre-trained by various transmit/ receive signals and HPA characteristics to adjust the parameters of the PD physical model, and may send the correction signal to the transmitter.

According to the present disclosure, to compensate the AM-AM and AM-PM effects of the HPA, an accurate physical-model based PD may be developed based on an extended Saleh's model. The Saleh's model is a commonly used power amplifier model, and has been proposed for characterizing HPA's amplitude (AM-AM) and phase (AM-PM) distortions accurately. The proposed extended model is designed especially for travelling wave tube (TWT) and/or solid HPAs. The extended Saleh's model may account for eight unknown parameters. In the following, a detailed description of the eight parameters of the extended Saleh's model will be provided.

Figure 3:
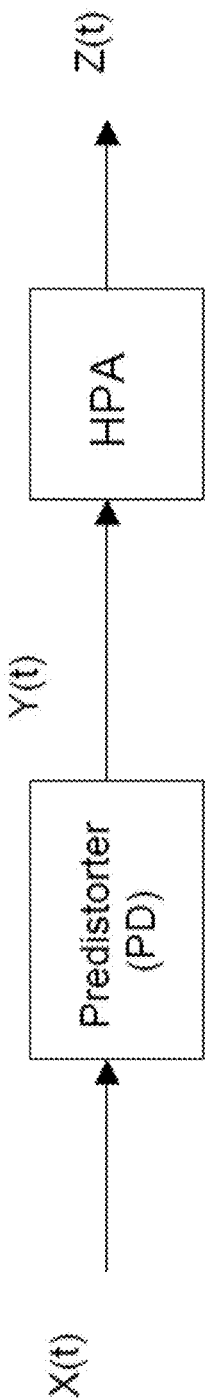
FIG. 3 illustrates a schematic block diagram of an exemplary linearizer according to various embodiments of the present disclosure.

FIG. 3 illustrates a simplified block diagram for a linearizer adopted to compensate the AM-AM and AM-PM effects of an HPA. Referring to FIG. 3, the complex signals X(t), Y(t), and Z(t) may be written as follows:

$$X(t) = \rho_{x(t)} e^{j\theta_{x(t)}} \quad (1)$$

$$Y(t) = \rho_{y(t)} e^{j\theta_{y(t)}} \quad (2)$$

$$Z(t) = \rho_{z(t)} e^{j\theta_{z(t)}} \quad (3)$$

where $\rho_{x(t)}$, $\rho_{y(t)}$, $\rho_{z(t)}$, and $\theta_{x(t)}$, $\theta_{y(t)}$, $\theta_{z(t)}$ are the amplitude and phase of the complex signals X(t), Y(t), and Z(t), respectively. By using $M(\rho_{y(t)})$ and $\Phi(\rho_{y(t)})$ to respectively represent the normalized AM-AM and AM-PM responses of the HPA due to the input signal X(t), Eq. (3) may then become:

$$Z(t) = M(\rho_{y(t)}) e^{j(\theta_{y(t)} + \Phi(\rho_{y(t)}))} \quad (4)$$

Then, the original Saleh's model may be extended for the HPA by including eight extra parameters ($a_0$, $a_1$, $b_0$, and $b_1$, together with $\alpha_0$, $\alpha_1$, $\beta_0$, and $\beta_1$), resulting in the following generalized equations for $M(\rho_{y(t)})$ and $\Phi(\rho_{y(t)})$:

$$M(\rho_{y(t)}) \equiv \rho_{z(t)} = \frac{\alpha_0 \rho_{y(t)}}{a_0 + \beta_0 (\rho_{y(t)} + b_0)^2} \quad (5)$$

$$\Phi(\rho_{y(t)}) = \frac{\alpha_1 \rho_{y(t)}^2}{a_1 + \beta_1 (\rho_{y(t)} + b_1)^2} \quad (6)$$

The eight unknown coefficients $a_0$, $a_1$, $b_0$, $b_1$, $\alpha_0$, $\alpha_1$, $\beta_0$ and $\beta_1$ may be computed to give the best fit of the parameter-dependent Eqs. (5) and (6) to the measured data. Note that these unknown parameters will be adjusted in the presence of interference by the proposed machine-learning based PD controller.

Further, from Eq. (2), $\exp(j\theta_{y(t)})$ may be written as:

$$e^{j\theta_{y(t)}} = \frac{Y(t)}{\rho_{y(t)}} \quad (7)$$

By using Eqs. (5), (6), and (7) to substitute the corresponding terms in Eq. (4), then $$Z(t) = \left[\frac{\alpha_0 Y(t)}{a_0 + \beta_0 (\rho_{y(t)} + b_0)^2}\right] e^{j\left[\frac{\alpha_1 \rho_{y(t)}^2}{a_1 + \beta_1 (\rho_{y(t)} + b_1)^2}\right]} \quad (8)$$

Further, from Eq. (8), it is obvious that the desired PD output for a given input X(t) may be:

$$Y(t) = X(t) \left[\frac{a_0 + \beta_0 (\rho_{y(t)} + b_0)^2}{\alpha_0}\right] e^{-j\left[\frac{\alpha_1 \rho_{y(t)}^2}{a_1 + \beta_1 (\rho_{y(t)} + b_1)^2}\right]} \quad (9)$$

Figure 4:
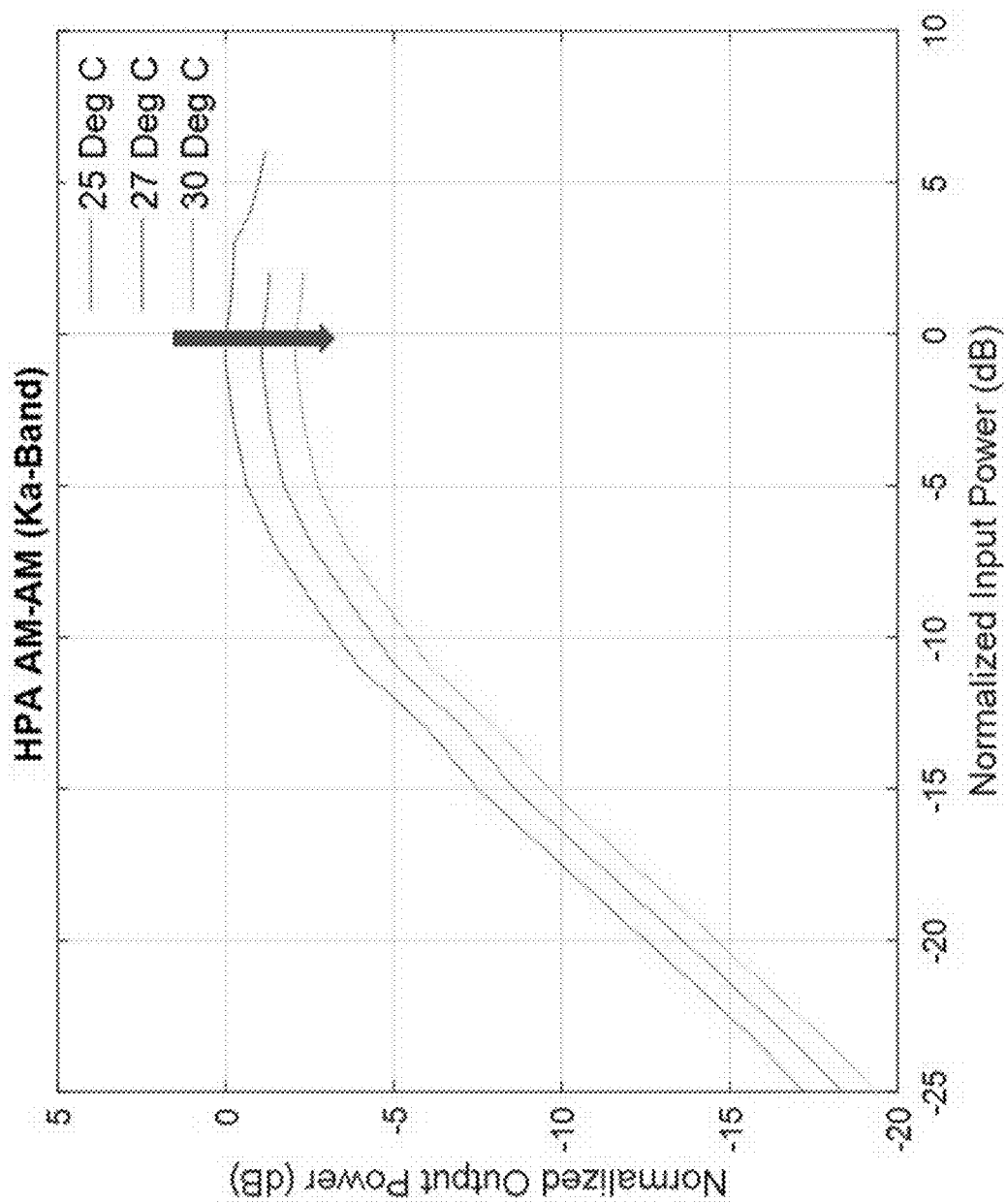
FIG. 4 illustrates measured AM-AM characteristics of an HPA at different temperatures.
Figure 5:
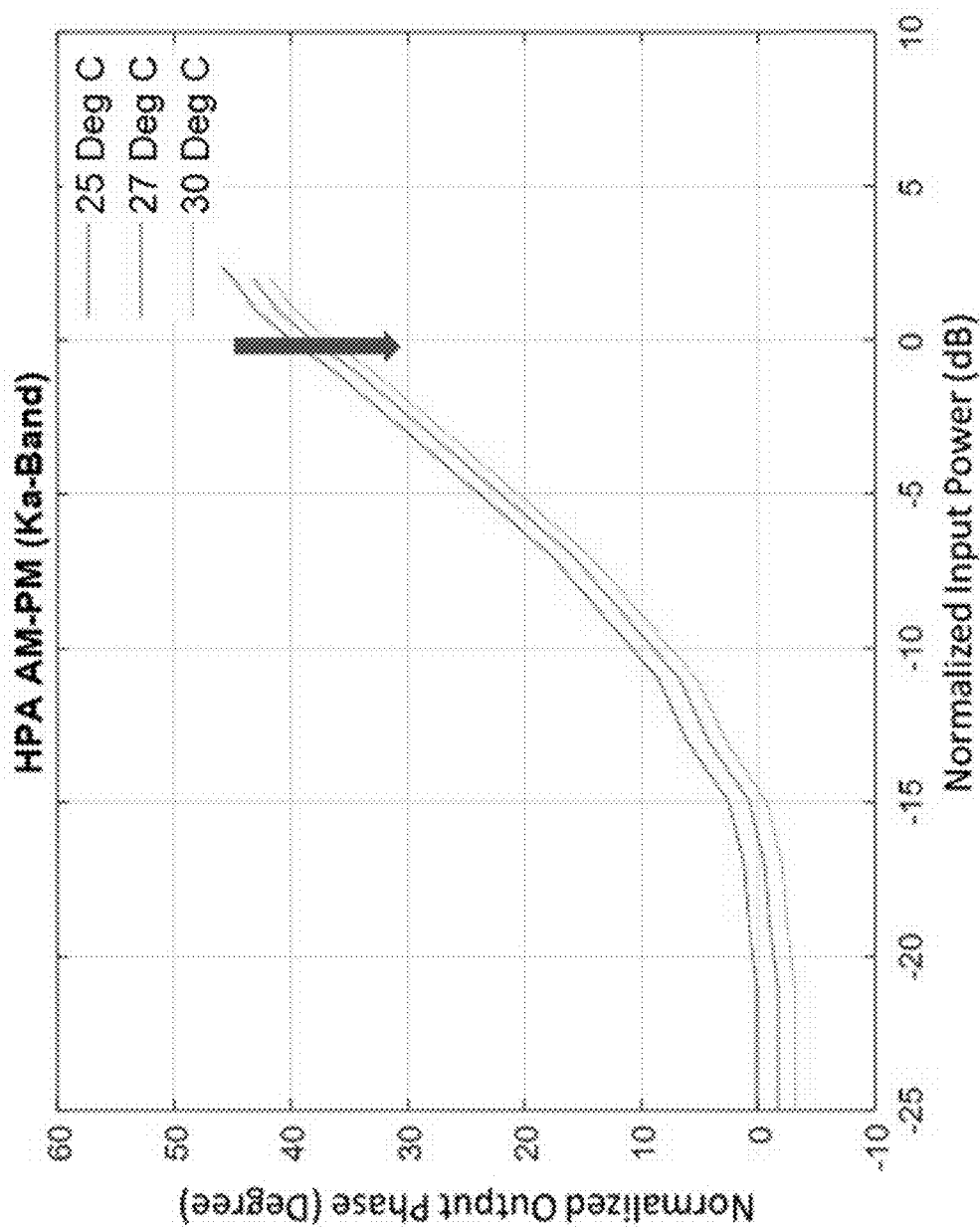
FIG. 5 illustrates measured AM-PM characteristics of an HPA at different temperatures.

For example, FIG. 4 illustrates exemplary measured AM-AM characteristics of a selected HPA at different temperatures, and FIG. 5 illustrates exemplary measured AM-PM characteristics of the HPA at different temperatures. In the following, the eight parameters introduced above may be obtained based on the HPA data shown in FIGS. 4 and 5.

Figure 6:
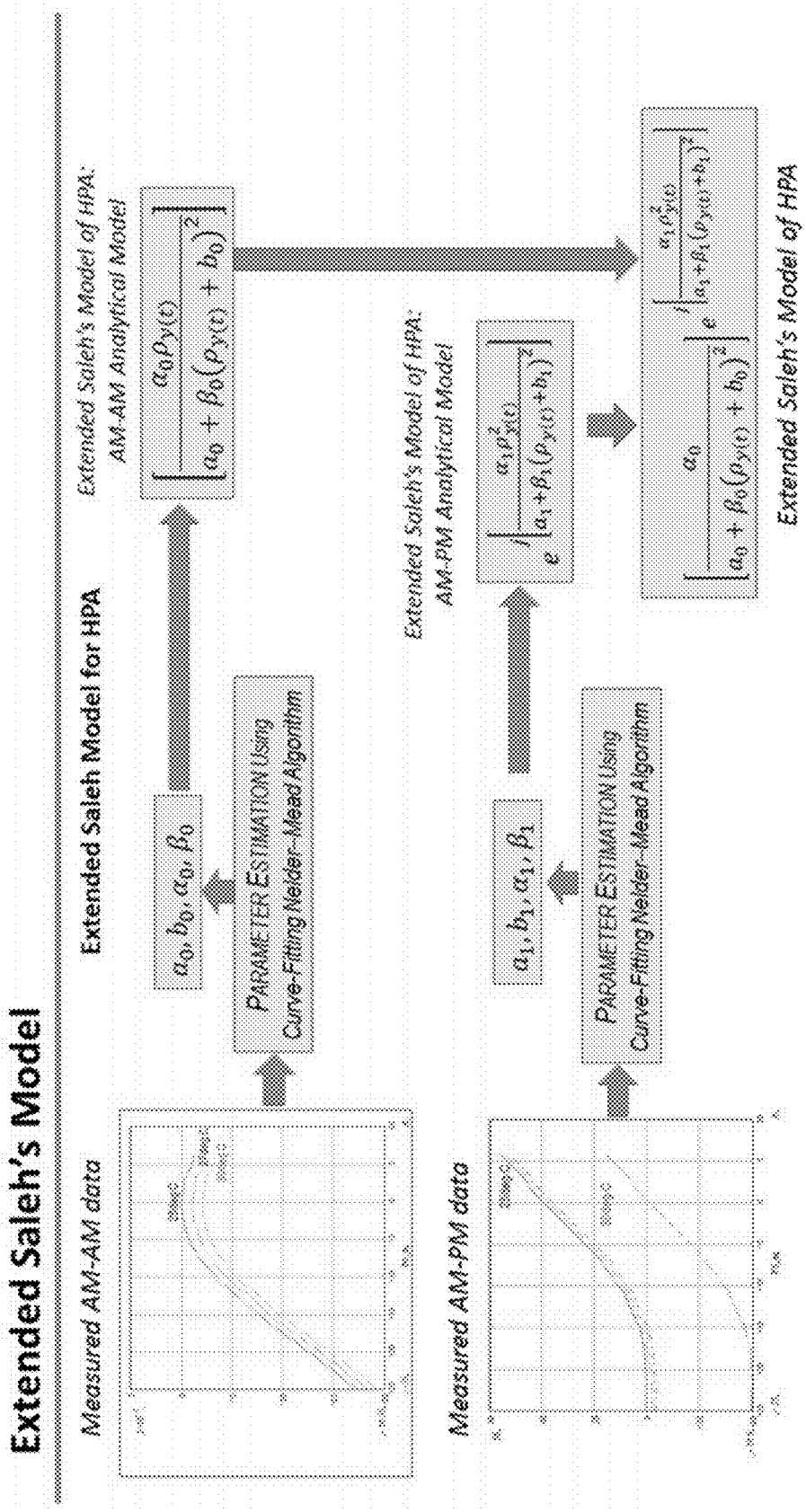
FIG. 6 illustrates a schematic work flow for achieving unknown parameters using a curve-fitting algorithm according to various embodiments of the present disclosure.

FIGS. 4 and 5 plot the normalized input power (dB) against the normalized output power (dB) and phase (Degree) respectively for the HPA at different temperature to demonstrate the AM-AM and AM-PM characteristics. In a desired situation, a perfect HPA placed in the satellite transponder may be operated at normal ambient temperature. Therefore, the AM-AM and AM-PM curves for 25° C. may be used to obtain the unknown parameters in Eqs. 5 and 6. The specific flow is demonstrated in FIG. 6. The measured data for a non-normal ambient temperature will be used to characterize the impact of external factors in the machine-learning based PD.

In detail, when the measured data (data for normal ambient temperature) of Eqs. (5) and (6) are provided, estimating coefficients $q_{AM} = (a_0, b_0, \alpha_0, \beta_0)$ and $q_{PM} = (a_1, b_1, \alpha_1, \beta_1)$ may be a problem to consider. That is, after providing the measured data $M^d(\rho_y(t_i))$ for AM-AM response of the HPA at time $t_i$, i=1, 2, . . . , N, it may further need to determine a best estimate for $\hat{q}_{AM}$ by using a least-squares criterion to minimize $$J(q_{AM}) = \Sigma |M(\rho_{y(t_i)}, q_{AM}) - M^d(\rho_{y(t_i)})|^2 \quad (10)$$

where $M(\rho_{y(t)}, q_{AM})$ is the normalized AM-AM response of the HPA due to the input signal $Y(t_i)$ at each time $t_i$, i=1,2, . . . , N corresponding to the parameter set $q_{AM}$. The parameter estimation problem for the parameter set $q_{PM}$ can also be formulated similarly.

The above optimization problem is an unconstrained minimization problem. The method used to obtain the solution to this minimization problem is based on function information computed on sequences of simplexes and is known as the Nelder-Mead algorithm. Basically, given the optimization problem $$\min_{q \in R^n} J(q),$$

where $q = q_{AM}$ or $q_{AM} \in R^4$, the Nelder-Mead algorithm may maintain a simplex of approximations to an optimal point. Further, it is assumed that the vertices $\{q_j\}_{j=1}^{n+1}$ are sorted according to the objective function values $$J(q_1) \leq J(q_2) \ldots J(q_{n+1}) \quad (11)$$

The point $q_1$ may be referred to as the best vertex and $q_{n+1}$ may be the worst vertex. The algorithm may attempt to change the worst vertex $q_{n+1}$ to a new point using the formula $$q(\delta) = (1+\delta)\bar{q} - \delta q_{n+1} \quad (12)$$

Here, $\bar{q}$ is the centroid of the convex hull of $\{q_j\}_{j=1}^{n+1}$. More specifically, $\bar{q}$ may be computed through the formula $$\bar{q} = \frac{1}{n}\sum_{i=1}^{n} q_i \quad (13)$$

The typical value for the parameter $\delta$ may be $$\delta = \{\delta_r, \delta_e, \delta_o, \delta_i\} = \{1, 2, 0.5, -0.5\} \quad (14)$$

which corresponds to the reflection, expansion, outside contraction, and inside contraction steps of the Nelder-Mead iteration.

The algorithm may terminate when either $J(q_1)-J(q_{n+1})$ is sufficiently small in absolute value or the number of function evaluations is larger than a user-prescribed value. In one embodiment, the optimal sets of parameters, which gave the desired least-squares fit to the HPA measured data may be given by $$q_{AM} = \{3.6407, 0.3063, 11.1163, 4.2947\} \quad (15)$$

and $$q_{PM} = \{0.4978, 0.1273, 74.6172, 1.0879\} \quad (16)$$

Figure 7:
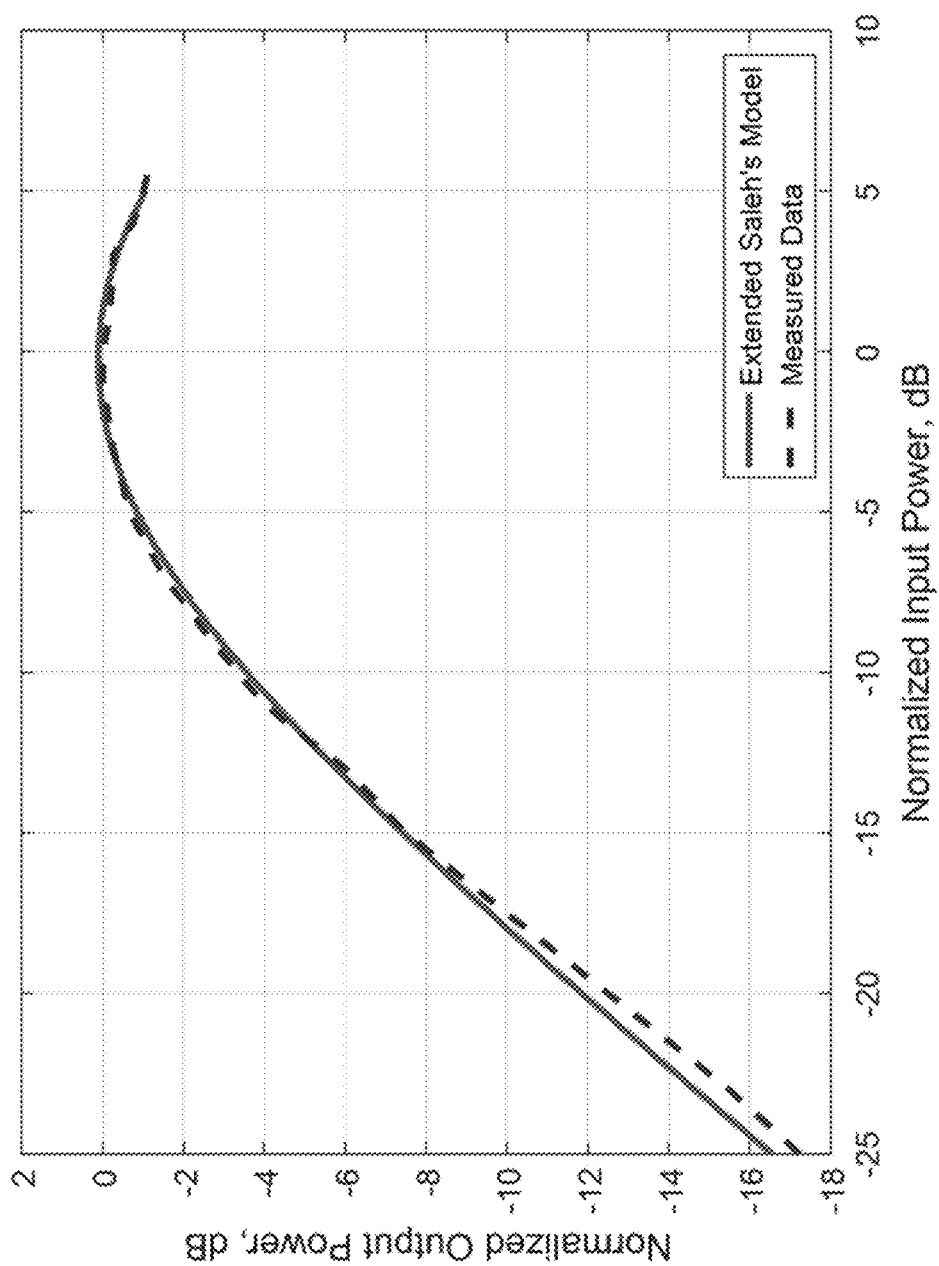
FIG. 7 illustrates a comparison between measured AM-AM characteristics of an HPA and calculated AM-AM characteristics of the HPA according to an extended Saleh's model.
Figure 8:
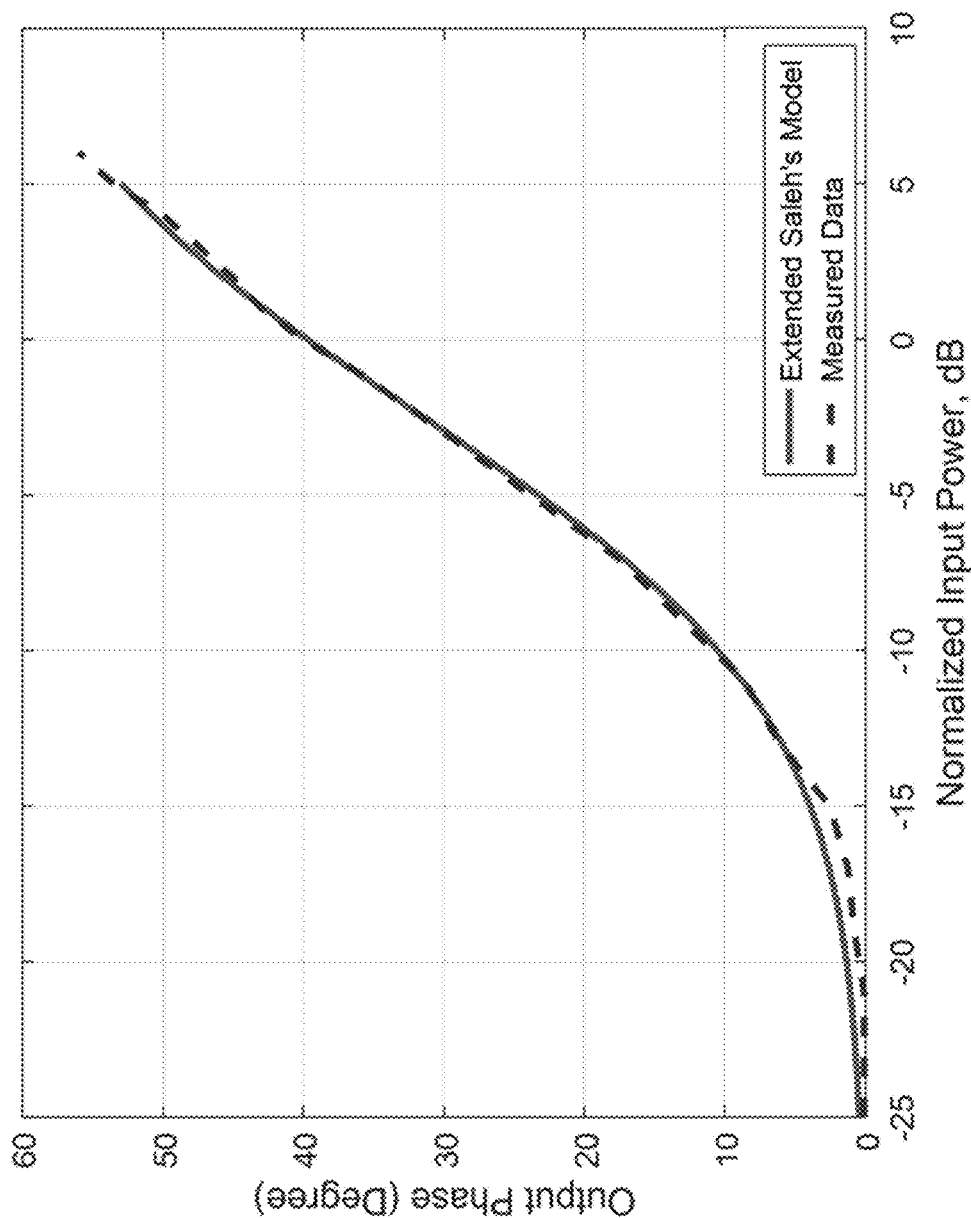
FIG. 8 illustrates a comparison between measured AM-PM characteristics of an HPA and calculated AM-PM characteristics of the HPA according to an extended Saleh's model.

With these estimated parameters, the derived AM-AM and AM-PM characteristics of the HPA according to Eqs. (5) and (6) are plotted in FIGS. 7 and 8, respectively. The plots show a very good agreement between the measured data and the model.

Further, the amplitude and the phase of the PD may be directly derived from Eq. (9), and the parameters obtained by modeling Eqs. (15) and (16) for the HPA may be copied to the PD. By implanting Eq. (1) into Eq. (9), the amplitude and the phase of the signal at the output of the PD may be $$\rho_{y(t)} = \left[\frac{a_0 + \beta_0(\rho_{y(t)} + b_0)^2}{\alpha_0}\right]\rho_{x(t)} \quad (17)$$

$$\theta_{y(t)} = \theta_{x(t)} - \left[\frac{\alpha_1 \rho_{y(t)}^2}{a_1 + \beta_1}\right] \quad (18)$$

It should be mentioned that the AM-AM relationship shown in Eq. (17) is usually expressed in terms of normalized input and output voltages or normalized input and output power. Solving for $\rho_{y(t)}$ from Eq. (17) and selecting only the negative sign for the square-root term in the numerator, $\rho_{y(t)}$ may be equal to $$\frac{(\alpha_0 - 2b_0\beta_0\rho_{x(t)}) - \sqrt{\alpha_0^2 - 4\beta_0\rho_{x(t)}(a_0\rho_{x(t)} + b_0\alpha_0)}}{2\beta_0\rho_{x(t)}^2} \quad (19)$$

It should be noted that because of the normalized input and output relationship, the negative sign is chosen to meet the dual conditions that the square root term is real and $0 \le \rho_{y(t)} \le 1$. When the amplitude and phase of the desired PD are assumed to be $\rho_{PD}$ and $\theta_{PD}$, respectively, the output y(t) of the PD may then be rewritten as $$Y(t) = X(t)\rho_{PD} e^{j\theta_{PD}} = \rho_{y(t)} e^{j\theta_{y(t)}} \quad (20)$$

Further, by implanting Eqs. (18) and (19) into Eq. (20) and equating the amplitude and phase terms separately for the desired PD, $\rho_{PD} = \rho_{y(t)}/\rho_{x(t)}$ may then become $$\rho_{PD} = \begin{cases} \dfrac{(\alpha_0 - 2b_0\beta_0\rho_{x(t)}) - \sqrt{\alpha_0^2 - 4\beta_0\rho_{x(t)}(a_0\rho_{x(t)} + b_0\alpha_0)}}{2\beta_0\rho_{x(t)}^2} & \rho_{x(t)} \le 1 \\ 1 & \rho_{x(t)} > 1 \end{cases} \quad (21)$$

and $$\theta_{PD} = -\frac{\alpha_1 \rho_{y(t)}^2}{a_1 + \beta_1(\rho_{y(t)} + b_1)^2} \quad (22)$$

Figure 9:
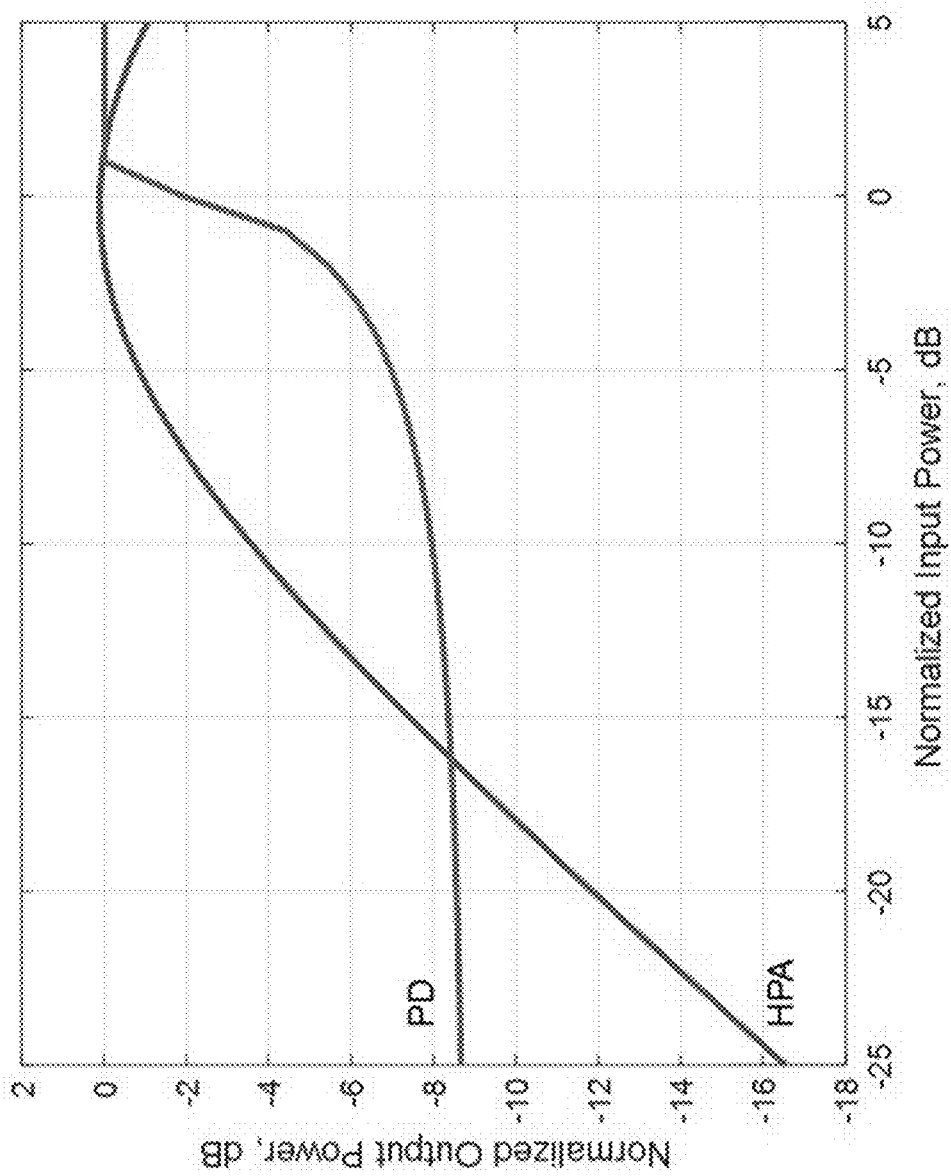
FIG. 9 illustrates a relationship between input power and output power of an HPA and a PD according to an extended Saleh's model.
Figure 10:
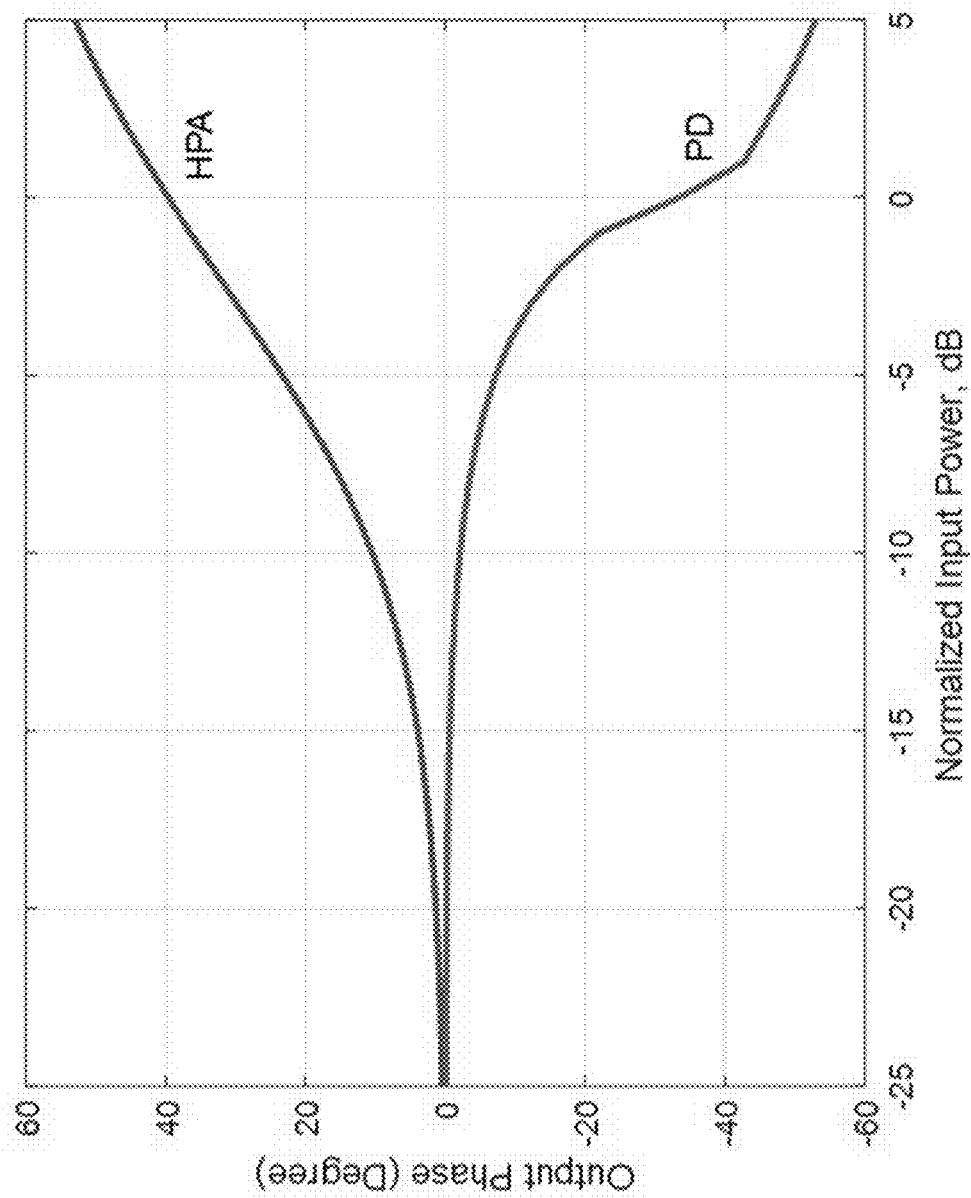
FIG. 10 illustrates a relationship between input power and output phase of an HPA and a PD according to an extended Saleh's model.

It should be noted that the saturation condition for the HPA is implied in Eq. (21). With Eqs. (21) and (22) derived along with curve-fitting values in Eqs. (15) and (16), the amplitude and phase responses of the PD can be plotted as FIG. 9 and FIG. 10, respectively. It can be observed that the derived PD may be able to compensate the power and phase shift caused by HPA nonlinearity.

In one embodiment, the impact of the disclosed PD on the bit error rate (BER) performance may be numerically evaluated. To establish the reference BER performance, a computer simulation may be implemented based on the simplified system set-up which the PD is placed on-board before the HPA.

To assess the end-to-end BER performance, a simplified transponder simulation model developed based on an actual transponder model may be adopted. However, for a high resolution BER curve, a simplified transponder model that characterizes the transponder imperfections may be needed to reduce simulation time from many hours to the order of 10-minutes. The simplified transponder model may characterize transponder intermodulation (IM) noise caused by HPA nonlinearity and transponder hardware imperfections, such as phase noise, amplitude ripple/phase shift due to filtering, quantization noise, and automatic gain control (AGC) effects, etc. It should be noted that the IM effect is characterized by noise power ratio (NPR). In addition, this simplified transponder model may also characterize actual waveform distortion due to AM-AM and AM-PM effects of the HPA.

In order to generate test signals using an additive white Gaussian noise (AWGN) to obtain NPR values, an industry standard method may be adopted, so the white noise may be first passed through a band pass filter (BPF) to produce an approximately square pedestal of noise of about the same bandwidths as signals being simulated. This signal may then be passed through a narrow-band reject filter to produce a deep notch (typically >50 dB) at the center of the noise pedestal. The noise signal may be used to excite the test amplifier. Amplification may be able to produce intermodulation products, which tend to fill in the notch. The depth of the notch at the output of the amplifier is the measure of the NPR.

In one embodiment, the measurement of NPR may be performed by using an actual wideband transponder model. The test signal may be generated using the AWGN model within 125 MHz bandwidth to represent a multicarrier signal. The test signal may then be passed through filters (bandpass and notch) to shape the test signal to the specific test signal, which is used to excite the actual satellite transponder model.

The BPF model implemented in MATLAB may use the finite impulse response (FIR) implementation approach with a filter order of 120, a passband bandwidth of 125 MHz, and a center at 250 MHz. The notched filter specifications used in the setup of this test may be: (i) notched depth=−60 dB;

(ii) notched bandwidth=7 MHz, and (iii) notched frequency=250 MHz. After the notch filter, the shaped AWGN test signal may then be passed through the actual transponder model with transponder noises on, and the output of the transponder may then be analyzed by calculating the power spectral density of the output signal. The simulated NPR test results may then be collected for typical X-band, $K_u$-band and $K_a$-band HPAs.

The NPR simulation test may be performed for typical X-band, $K_u$-band and $K_a$-band HPAs operating at saturation. With the input power back-off (IPBO) equal to 5 dB, 7 dB, 10 dB, 13 dB, and 15 dB, respectively, the results were captured in Table 1. Referring to Table 1, the NPR results for X, $K_u$ and $K_a$ bands may be about the same, except at IPBO=0 dB, NPR for $K_a$-band may be worse than X and $K_u$.

TABLE 1

Simulated NPR Results for AWGN Test Case with Satellite Transponder Model for Typical X-Band, $K_u$-Band and $K_a$-Band HPAs
Simulated NPR Using White Noise Approach with Satellite Transponder Model (dB)

| Frequency Band | IPBO = 0 dB (Saturation) | IPBO = 5 dB | IPBO = 7 dB | IPBO = 10 dB | IPBO = 13 dB | IPBO = 15 dB |
| --- | --- | --- | --- | --- | --- | --- |
| Ka-Band | −17.13 | −17.6 | −18.27 | −19.5 | −20.23 | −20.1 |
| Ku-Band | −17.22 | −17.79 | −19.06 | −19.06 | −19.67 | −26.38 |
| X-band | −16.55 | −17.22 | −19.06 | −19.07 | −19.67 | −26.39 |

Figure 11:
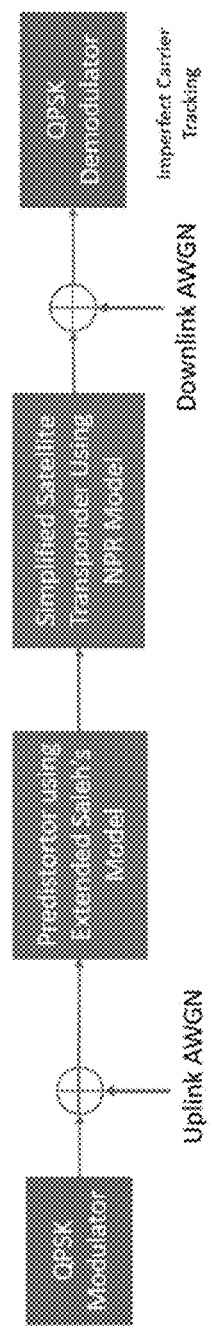
FIG. 11 illustrates a schematic block diagram of a simulation set-up for QPSK performance in an AWGN and NPR transponder model with an exemplary physical-model based PD according to various embodiments of the present disclosure.

To assess the performance of the linearized transponder model with a PD integrated, and understand the impact of the disclosed linearization method on the practical tactical waveforms, an exemplary simulation set-up is shown in FIG. 11.

According to the present disclosure, the NPR using the AWGN noise may be employed as the test signal. Table 1 shows that the NPR at IPBO=0 dB for $K_a$-band is −17.1 dB. The overall bit signal-to-noise ratio (BSNR) for the system described in Eq. (23) may be as follows $$\left(\frac{E_b}{N_o}\right)_o = \left[\left(\left(\frac{E_b}{N_o}\right)_{Up}\right)^{-1} + \left(\left(\frac{E_b}{N_o}\right)_{Down}\right)^{-1} + \left(\frac{C}{I}\right)_{IM}^{-1}\right]^{-1} \quad (23)$$

where $$\left(\frac{E_b}{N_o}\right)_o$$

is the overall Bit Signal to Noise Ratio (BSNR), $$\left(\frac{E_b}{N_0}\right)_{Up}$$

is the Uplink BSNR, $$\left(\frac{E_b}{N_0}\right)_{Down}$$

is the downlink BSNR, and $$\left(\frac{C}{I}\right)_{IM}$$

is the carrier-to-intermodulation noise power ratio and is defined as $$\left(\frac{C}{I}\right)_{IM} = NRP^{-1}.$$

At the receiver, an imperfect carrier tracking may be assumed. For example, the carrier phase tracking error is a random variable with a Gaussian distribution having a zero mean and a variance characterized by time-product bandwidth $\delta$. Then, the BER performance of quadrature phase shift keying (QPSK) modem may be calculated for the NPR transponder model with the PD.

For example, from the plot of the BER curves for QPSK signal passing through the NPR transponder model with and without a PD, it can be observed that the extended Saleh's PD model may provide about 1 dB BSNR gain at BER=0.001. The theoretical QPSK and imperfect carrier tracking without passing through transponder BER curves may also be provided for reference. It should be noted that because the system is linearized to generate less intermodulation products due to predistortion, −20 dB is adopted in Table 1 for NPR in the case with the PD.

Further, the BER performance for QPSK signal passing through the NPR transponder model may be compared with the PD at $K_a$-band with temperature as a dynamic parameter. In one embodiment, the BER performance may degrade when the HPA ambient temperature varies from 25° C. to 30° C. since the optimal parameters of the extended Saleh's PD model was derived based on the HPA data at 25° C. These parameters will be optimized for 27° C. and 30° C. by using a machine learning algorithm according to various embodiments of the present disclosure.

Digital predistortion may be a baseband signal processing approach that compensates the power and phase shift caused by the power amplifiers. According to the present disclosure, the spectral regrowth may be used to evaluate the PD performance. The term spectrum regrowth may be first used to describe the intermodulation products that are generated when a digital transmitter is added to an analog transmission system. In one embodiment, the spectral regrowth is mainly caused by the nonlinearity of the HPA.

Figure 12:
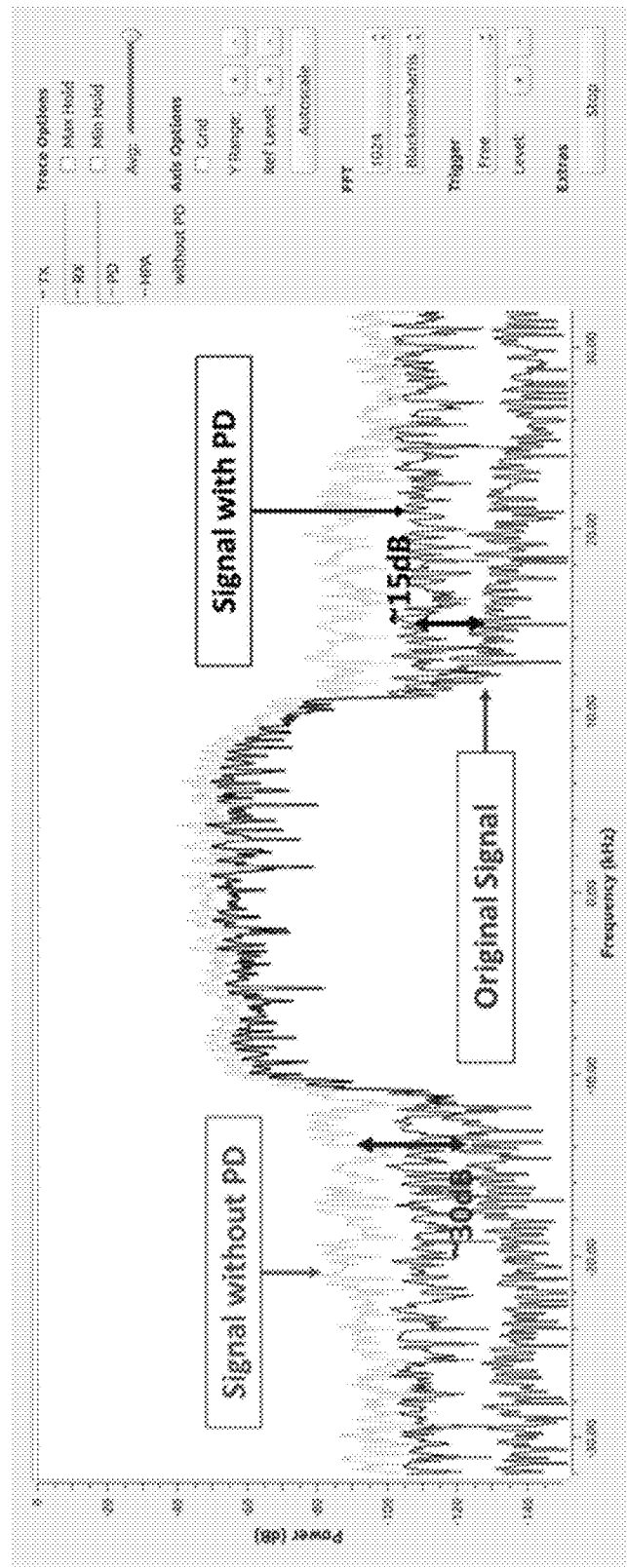
FIG. 12 illustrates an exemplary predistortion linearization performance assessment in terms of spectral regrowth suppression.

Further, in one embodiment, as shown in FIG. 12, a signal with a bandwidth of 10 kHz may be used to validate the proposed model-based approaches. In addition, an AWGN channel with a 27 dB of signal-to-noise ratio (SNR) may be considered. Referring to FIG. 12, without the PD deployed in the system, a large spectrum regrowth of approximate 30 dB may be observed. However, when the PD is deployed in the system, because the developed PD is able to estimate the power and phase shift of the input signal and provide corresponding power and shift compensations, the disclosed linearization method may significantly reduce the spectral regrowth effect caused by the HPA. As shown in FIG. 12, the spectrum regrowth may be reduced to about 15 dB when the PD is deployed in the system.

Figure 2:
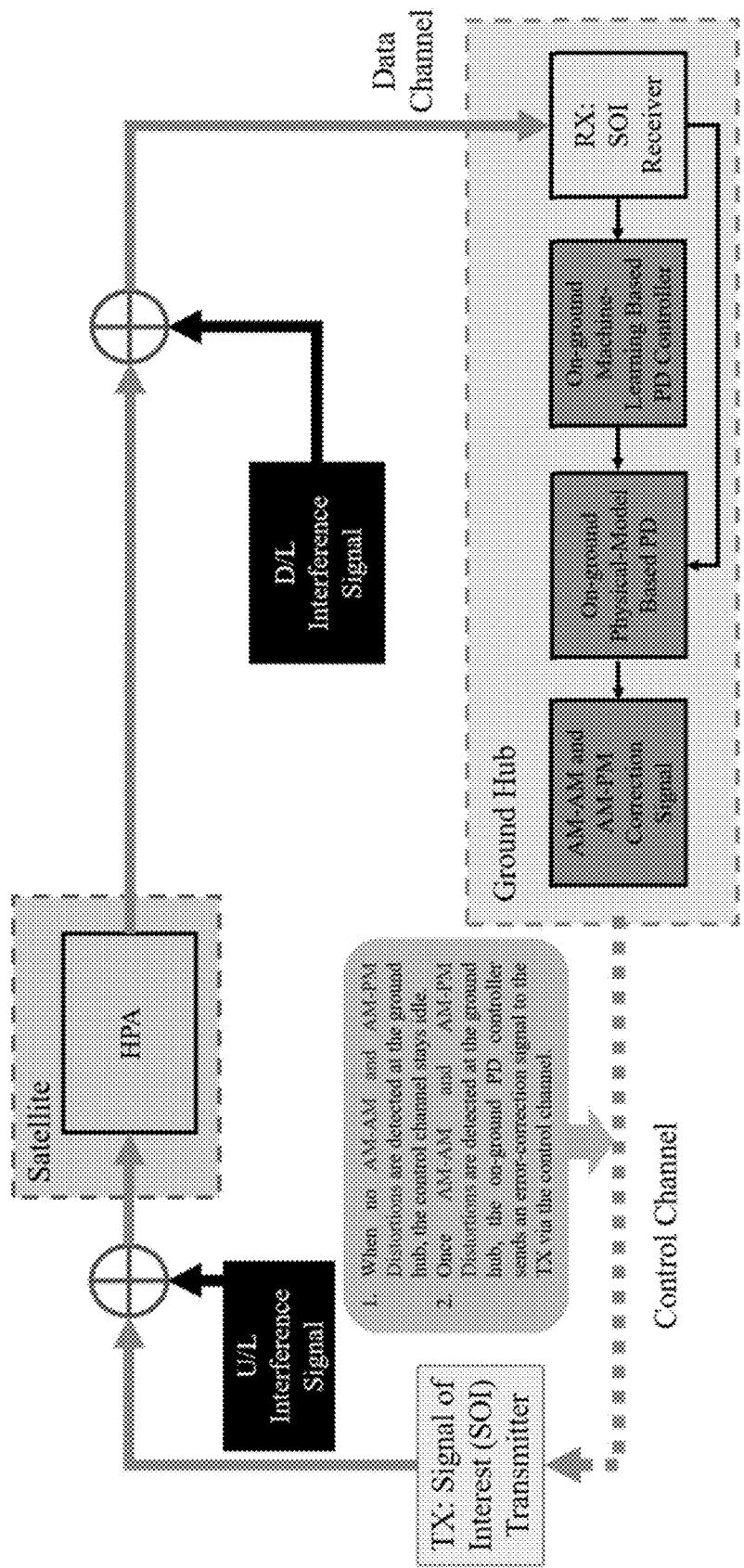
FIG. 2 illustrates a schematic diagram of an architecture of an exemplary on-ground PD solution according to various embodiments of the present disclosure.

Referring to FIG. 2, the disclosed PD may include a processor and a memory. The memory of the PD may be used to store computer-executable instructions. The PD may be disposed in a ground hub, and the ground hub is arranged in a SATCOM system together with a transmitter and a satellite transponder, and the satellite transponder includes an HPA. When the computer-executable instructions are executed, the processor is configured to determine an initial correction signal, including an AM-AM correction signal and an AM-PM correction signal, based on a physical model with a plurality of PD parameters, and send the initial correction signal to the transmitter to compensate AM-AM and AM-PM characteristics of the HPA; and in respond to the PD controller taking an action to adjust the plurality of PD parameters, generate an updated correction signal, and send the updated correction signal to the transmitter to compensate the AM-AM and AM-PM characteristics of the HPA.

According to the disclosed PD, a curve-fitting algorithm may be adopted to estimate the AM-AM and AM-PM nonlinear distortions. In one embodiment, based on an extended Saleh's model, the measured AM-AM characteristics of the HPA may be fitted by $$\frac{\alpha_0 \rho_{y(t)}}{a_0 + \beta_0 (\rho_{y(t)} + b_0)^2}$$

where $\rho_{y(t)}$ is the amplitude of the input complex signal, and $a_0$, $b_0$, $\alpha_0$, and $\beta_0$ are PD parameters, and the measured AM-PM characteristics of the HPA may be fitted by $$\frac{\alpha_1 \rho_{y(t)}^2}{a_1 + \beta_1 (\rho_{y(t)} + b_1)^2}$$

where $a_1$, $b_1$, $\alpha_1$, and $\beta_1$ are PD parameters. When fitting the normalized AM-AM response or the normalized AM-PM response of the HPA, a least-squares criterion may be used to determine the best fit.

Further, the normalized correction signal may be determined using the PD parameters obtained above. In one embodiment, based on the extended Saleh's model, the normalized correction signal may be determined using $a_0$, $b_0$, $\alpha_0$, $\beta_0$, $a_1$, $b_1$, $\alpha_1$, and $\beta_1$ obtained above. The AM-AM correction signal and the AM-PM correction signal may be $$\begin{cases} \frac{(\alpha_0 - 2b_0\beta_0\rho_{x(t)}) - \sqrt{\alpha_0^2 - 4\beta_0\rho_{x(t)}(a_0\rho_{x(t)} + b_0\alpha_0)}}{2\beta_0\rho_{x(t)}^2} & \rho_{x(t)} \leq 1 \\ 1 & \rho_{x(t)} > 1 \end{cases}$$

and $$-\frac{\alpha_1 \rho_{y(t)}^2}{a_1 + \beta_1 (\rho_{y(t)} + b_1)^2},$$

respectively.

Further, the normalized correction signal may be sent to the HPA through a transmitter that connects to the output terminal of the on-ground physical-model based PD via a control channel. As such, compensation to the AM-AM and AM-PM characteristics of the HPA may be provided and HPA linearization may be achieved.

The present disclosure also provides a machine-learning based PD controller for HPA linearization. The machine-learning based PD controller may be able to promptly determine the PD parameters based on past experience and correspondingly update the PD parameters. Therefore, the disclosed machine-learning based PD controller may provide dynamic and real-time control for optimizing the performance of the PD.

Humans are expert in solving a wide variety of challenging problems, from low-level motor control to high-level cognitive tasks. The disclosed machine-learning based adaptive on-ground PD controller is aimed to create artificial agents that can achieve a similar level of performance and generality. Like a human, the agents of the present disclosure may learn for themselves to achieve successful strategies which lead to desired long-term rewards. This paradigm of learning by trial-and-error, solely from rewards or punishments, is known as reinforcement learning (RL).

Formally, the RL environment can be described as a Markov decision process (MDP), which includes s set of states $\mathcal{S}$, plus a distribution of starting states $p(s_0)$, a set of action $\mathcal{A}$, transition dynamics $\mathcal{T}(s_{t+1}|s_t, a_t)$ that map a state-action pair at time t to a distribution of states at time t+1, a reward function $r(s_t, a_t, s_{t+1})$, and a discount factor $\gamma \in [0, 1]$, where smaller values place more emphasis on immediate rewards. According to the disclosed PD controller, when estimating an action-value function, the discount factor γ may be used to reduce the weight of the reward function corresponding to the former action in every two consecutive actions. It is supposed that an agent interacts with an environment $\mathcal{S}$, in a sequence of actions, observations, and rewards. At each time-step the agent selects an action $a_t \in \mathcal{A}$, $\mathcal{A} = \{1, \ldots, K\}$, the action may be passed to the environment and may modify its internal state and the corresponding reward. The system's internal state may not be observable to the agent most of time, instead various target features of interest from the environment, such as the signal features discussed in the following, may be observed. In addition, a reward r representing the change in the overall system performance may be received.

Figure 13:
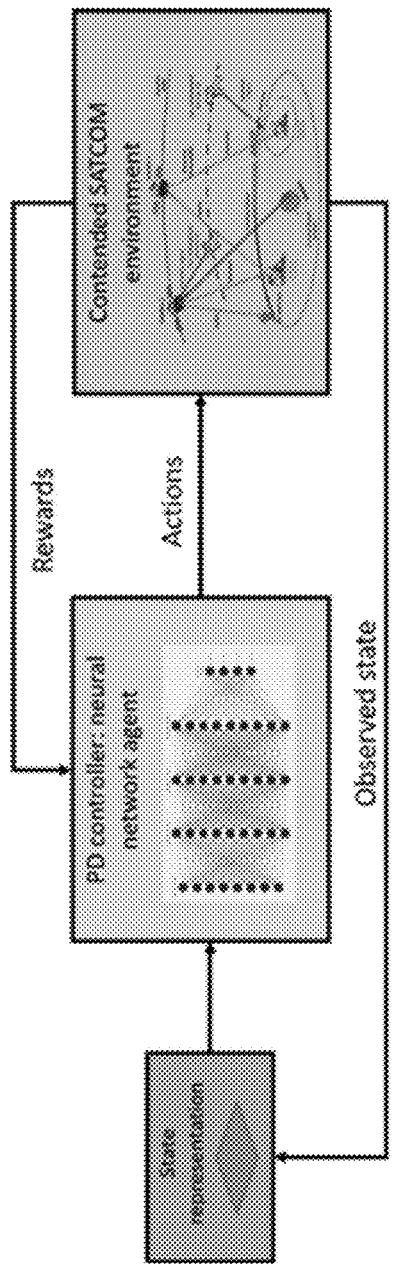
FIG. 13 illustrates a schematic diagram of an architecture of reinforcement learning according to various embodiments of the present disclosure.
Figure 14:
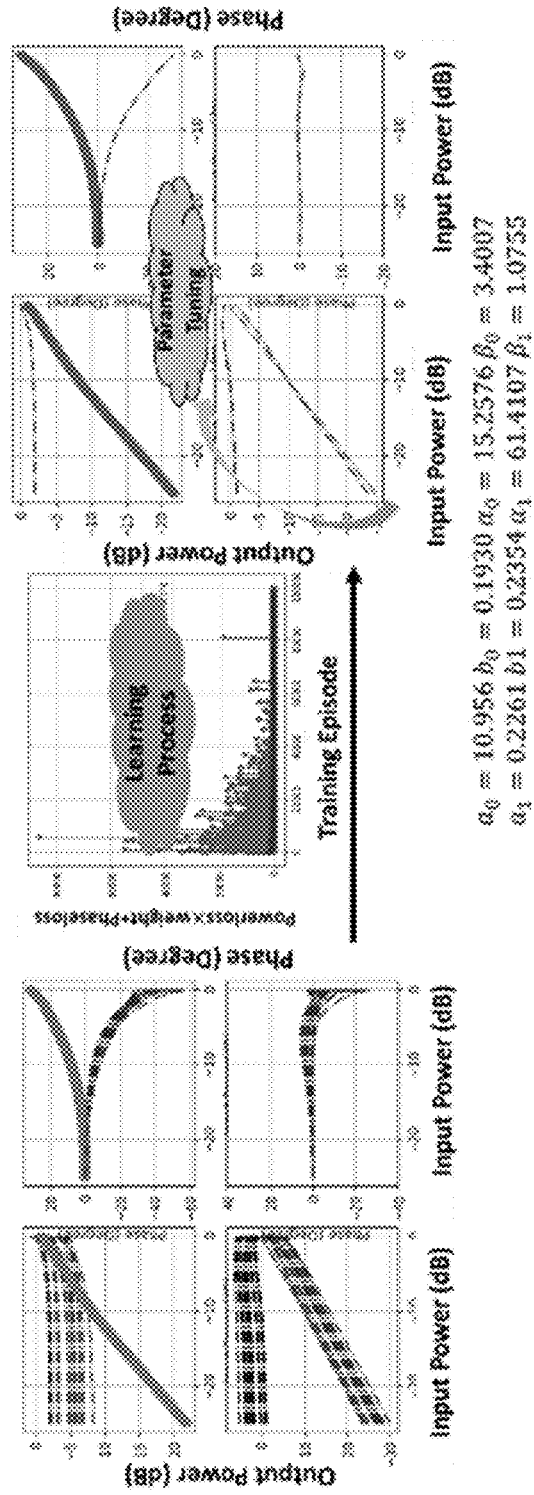

According to the present disclosure, an RL approach may be leveraged to achieve optimum linearization performance in various environmental conditions. FIG. 13 illustrates a general learning process for an on-ground PD controller that adopts an RL technique. In the disclosed design, the PD controller may behave as an agent taking actions, and may use the rewards or punishments returned from environment and target states to train and make the best decision in certain circumstances.

To specifically solve the PD problem, the state, action, and rewards function may be defined as follows:

Actions: an action may be an operation that the PD takes to adjust (increase or decrease within a certain range) of the 8 parameters of the extended Saleh's model, namely ($a_0$, $b_0$, $\alpha_0$, $\beta_0$) and ($a_1$, $b_1$, $\alpha_1$, $\beta_1$). The first four parameters directly correspond to the AM-AM relations, and the AM-PM are characterized based on these 8 parameters together.

States: a state may be an observable (at least partially) status of the PD controller's relation with the environment, and is defined as power and phase of the output power.

Rewards: for given "Input Power" (or $P_{in}$) and "Input Phase" (or $Phase_{in}$), the rewards function may be the distance between estimated and measured output power and phase of the HPA, namely $\Delta_p = \sqrt{(P_{out_{est}} - P_{out_{mea}})^2}$ and $\Delta_{phase} = \sqrt{(Phase_{out_{est}} - Phase_{out_{mea}})^2}$. Regarding the reward function definition, it can be further simplified by analyzing the characteristics of the PD and the HPA.

To accurately model a PD in the presence of interference signals or imperfect equipment, the goal of the agent is to interact with the environment by correctly classifying the interference to maximize future rewards. In one embodiment, a standard assumption may be made: the future rewards are discounted by a factor of $\gamma$ per time-step, and the future discounted return at time t may be defined as $$R_t = \sum_{t'=t}^{T} \gamma^{t'-t} r_{t'},$$

where T is the time-step at which the game terminates. The optimal action-value function Q*(s,a) may be defined as the maximum expected return achieved by following a strategy, after seeing some sequence s and then taking some action a, $$Q^*(s, a) = \max_{\pi} E[R_t \mid s_t = s, a_t = a, \pi],$$

where $\pi$ is a policy mapping sequences to actions.

The optimal action-value function may satisfy an important identity known as the Bellman equation, $$Q^*(s, a) = E_{s'\sim S}\left[r + \gamma \max_{a'} Q^*(s', a') \mid s, a\right] \quad (24)$$

If the optimal value Q*(s,a) of the sequences s' at the next time-step is known for the all possible actions a', then the optimal strategy may be to select the action a' that maximizes the expected value of r+γQ*(s',a'). The basic idea behind many RL algorithms is to estimate the action-value function by using the Bellman equation as an iterative update, $$Q_{i+1}(s, a) = E_{s'\sim S}\left[r + \gamma \max_{a'} Q_i(s', a') \mid s, a\right] \quad (25)$$

Such value iteration algorithms converge to the optimal action-value function, $Q_i \to Q^*$, as $i \to \infty$. In practice, this basic approach may be totally impractical for the action-value function and may be estimated separately for each sequence without any generalization. Instead, a function approximator may be commonly used to estimate the action-value function, Q(s,a;θ)≈Q*(s,a). In the RL, a linear function approximator may be typically used, but sometimes a non-linear function approximator, such as a neural network, may be adopted instead. A Q-network may utilize the neural network function as the value-function approximator. A Q-network can be trained by minimizing a sequence of loss function $$L_i(\theta_i) = E_{s,a\sim\rho(\cdot)}[y_i - Q(s,a;\theta_i)^2] \quad (26)$$

where $$y_i = E_{s'\sim S}\left[r + \gamma \max_{a'} Q_i(s', a'; \theta_{i-1}) \mid s, a\right]$$

is the target for iteration i, and ρ(s,a) is a probability distribution over sequences s and a which may be referred to as the behavior distribution. The parameters from the previous iteration $\theta_{i-1}$ may be held fixed when optimizing the loss function $L_i(\theta_i)$. Differentiating the loss function with respect to the weights, the following gradient can be described as follow, $$\nabla_{\theta_i} L_i(\theta_i) = \quad (27)$$

$$E_{s,a\sim\rho(\cdot);s'\sim S}\left[\left(r + \gamma \max_{a'} Q(s', a'; \theta_{i-1}) - Q(s, a; \theta_i)\right)\nabla_{\theta_i} Q(s, a; \theta_i)\right].$$

Rather than computing the full expectation in the above gradient, it is often computationally expedient to optimize the loss function by stochastic gradient descent. The weights may be updated after every time-step, the expectations may be replaced by single samples from the behavior distribution ρ and the environment $\mathcal{S}$ respectively, and Q-learning may be developed based on the discussion above.

It should be noted that the above algorithm is model-free, and may solve the RL task directly using samples from the environment $\mathcal{S}$, without explicitly constructing an estimate of $\mathcal{S}$. Also, the algorithm may learn the optimal policy through a greedy search strategy $$a = \max_{a} Q(s, a; \theta),$$

while following a behavior distribution that ensures adequate exploration of the state space. In practice, the behavior distribution may often be selected by an ∈-greedy strategy that follows the greedy strategy with probability 1−∈ and selects a random action with probability ∈.

In the following, a scenario in which the PD is on the ground with noise/interference (AWGN, constant, and partial time partial band (PTPB)) existing between the PD and the HPA is provided as an example for further illustration. It has been proved through simulation and hardware implementation that the proposed machine learning approach can successfully update the PD coefficients to better adjust to the ambient environment efficiently. The linearization performance and end-to-end BER performance in different scenarios were evaluated with significant improvements comparing to them by solely using a physical-based PD.

In a first case regarding the on-ground PD design, it is supposed that AWGN exists between the PD and the HPA. The noise may be characterized based on $E_b/N_0$, and the parameter set for the PD may be the optimal value for the ambient environment of 25° C. The corresponding BER performance indicates that given the same BER rate, there may be a gap of approximately 2 dB. The proposed machine learning approach can update the PD parameters based on the reward defined above to improve the HPA linearity.

In one embodiment, after being processed using the machine learning model, an updated parameter set, including $a_0$=10.956, $b_0$=0.1930, $\alpha_0$=15.2576, $\beta_0$=3.4007, $a_1$=0.2261, $b_1$=0.2354, $\alpha_1$=61.4107, and $\beta_1$=1.0755, may be achieved, and given the bit error rate, the BER performance improvement may be approximately 1 dB.

Moreover, a case in which the PTPB interference exists between the PD and the HPA may also be studied. For example, the PTPB with activate rate 0.2 and 0.9 may heavily affect the HPA linearity. The initial parameter set for the PD may be achieved based on the extended Saleh's model. The proposed machine learning approaches can dynamically update the PD parameter set to adjust to the changing environment.

The updated PD may be able to significantly improve the BER curve which indicates that the proposed approach can improve the system performance in terms of the system linearity. In the design of the machine learning approaches, the operator can also set the weights of the AM-AM and AM-PM in the learning process. The detail of improving the system performance may be referred to the corresponding content described in the embodiments of the disclosed satellite transponder linearization method.

The present disclosure provides a PD controller to implement the functions described above. The PD controller may include a processor, a memory, and a data storage. The PD controller may be arranged in a ground hub which further includes a PD consistent with various embodiments of the present disclosure. The ground hub may be arranged in a SATCOM system together with a transmitter and a satellite transponder, the satellite transponder includes an HPA. The PD controller receives a signal from the satellite transponder. Moreover, the memory of the PD controller may be configured to store computer-executable instructions, and the data storage may be configured to store a database that includes a set of environmental parameters and a set of PD parameters corresponding to the set of environmental parameters. When the computer-executable instructions are executed, the processor of the PD controller is configured to determine a reward function for an action taken by the PD controller based on the received signal and environmental parameters; examine an action-value function for actions taken in a preset past period based on reward functions of the actions; take an action, based on the measured environment parameters and the action-value function, to adjust a plurality of PD parameters for the PD to generate an updated correction signal; and update the database, including the set of environmental parameters and the set of PD parameters, in a real-time manner according to the environment parameters, the plurality of PD parameters, and the action-value function.

The present disclosure provides an HPA linearization method, applied to a ground hub which includes a predistorter (PD) and a PD controller. The PD controller stores a database including a set of environmental parameters and a set of PD parameters corresponding to the set of environmental parameters. The ground hub is arranged in a SATCOM system together with a transmitter and a satellite transponder, and the satellite transponder includes an HPA. The HPA linearization method includes determining an initial correction signal including an AM-AM correction signal and an AM-PM correction signal based on a physical model with a plurality of PD parameters, and sending the initial correction signal to the transmitter to compensate AM-AM and AM-PM characteristics of the HPA; receiving a signal from the satellite transponder; determining a reward function for an action taken by the PD controller based on the received signal and environmental parameters; examining an action-value function for actions taken in a preset past period based on reward functions of the actions; taking an action, based on the environment parameters and the action-value function, to adjust the plurality of PD parameters for the PD to generate an updated correction signal; sending the update correction signal to the transmitter to compensate the AM-AM and AM-PM characteristics of the HPA; and updating the database in a real-time manner according to the environment parameters, the plurality of PD parameters, and the action-value function.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A high power amplifier (HPA) linearization method, applied to a ground hub which includes a predistorter (PD) and a PD controller, wherein the PD controller stores a database including a set of environmental parameters and a set of PD parameters corresponding to the set of environmental parameters, the ground hub is arranged in a satellite communication (SATCOM) system together with a transmitter and a satellite transponder, and the satellite transponder includes an HPA, the method comprising:

determining an initial correction signal including an amplitude modulation-to-amplitude modulation (AM-AM) correction signal and an amplitude modulation-to-phase modulation (AM-PM) correction signal based on a physical model with a plurality of PD parameters, and sending the initial correction signal to the transmitter to compensate AM-AM and AM-PM characteristics of the HPA;

receiving a signal from the satellite transponder;

determining a reward function for an action taken by the PD controller based on the received signal and environmental parameters;

examining an action-value function for actions taken in a preset past period based on reward functions of the actions;

taking an action, based on the environment parameters and the action-value function, to adjust the plurality of PD parameters for the PD to generate an updated correction signal;

sending the update correction signal to the transmitter to compensate the AM-AM and AM-PM characteristics of the HPA; and updating the database in a real-time manner according to the environment parameters, the plurality of PD parameters, and the action-value function.

2. The method according to claim 1, wherein determining, by the PD, the initial correction signal based on the physical model with more than four PD parameters includes:

sending a signal to the satellite transponder from the ground hub through the transmitter and receiving a signal sent back from the satellite transponder to the ground hub;

calculating the AM-AM and AM-PM characteristics of the HPA according to the signal sent to the satellite transponder and the signal received from the satellite transponder;

simulating the AM-AM and AM-PM characteristics of the HPA using the physical model with the plurality of PD parameters; and determining the initial correction signal, including the AM-AM correction signal and the AM-PM correction signal, based on obtained values of the plurality of PD parameters.

3. The method according to claim 2, wherein simulating the AM-AM and AM-PM characteristics of the HPA further includes:

fitting the AM-AM characteristics of the HPA by $$\frac{\alpha_0 \rho_{y(t)}}{a_0 + \beta_0 (\rho_{y(t)} + b_0)^2},$$

where $\rho_{y(t)}$ is an amplitude of an input complex signal, and $a_0$, $b_0$, $\alpha_0$, and $\beta_0$ are four PD parameters of the plurality of PD parameters; and fitting the AM-PM characteristics of the HPA by $$\frac{\alpha_1 \rho_{y(t)}^2}{a_1 + \beta_1 (\rho_{y(t)} + b_1)^2},$$

where $a_1$, $b_1$, $\alpha_1$, and $\beta_1$ are four PD parameters of the plurality of PD parameters.

4. The method according to claim 3, wherein:
a least-squares criterion is used to determine fits to the AM-AM and AM-PM characteristics of the HPA.

5. The method according to claim 3, wherein determining the initial correction signal based on the obtained values of the plurality of PD parameters includes:
determining the AM-AM correction signal as $$\begin{cases} \frac{(\alpha_0 - 2b_0\beta_0\rho_{x(t)}) - \sqrt{\alpha_0^2 - 4\beta_0\rho_{x(t)}(a_0\rho_{x(t)} + b_0\alpha_0)}}{2\beta_0\rho_{x(t)}^2} & \rho_{x(t)} \le 1 \\ 1 & \rho_{x(t)} > 1 \end{cases};$$

and
determining the AM-PM correction signal as $$-\frac{\alpha_1 \rho_{y(t)}^2}{a_1 + \beta_1 (\rho_{y(t)} + b_1)^2}.$$

6. The method according to claim 2, wherein:
the environmental parameters are observable external factors, including equipment imperfections, temperature variation, and interference signals.

7. The method according to claim 1, further including:
when taking the action to adjust the plurality of PD parameters for the PD to generate the updated correction signal, estimating an output power and an output phase for the HPA, wherein:
the reward function is defined as a distance between estimated and measured output power and phase of the HPA.

8. The method according to claim 2, wherein:
when examining the action-value function for actions taken in the preset past period based on reward functions of the actions, for every two consecutive actions, a discount factor is used to reduce a weight of the reward function corresponding to a former action between the two consecutive actions.

9. A predistorter (PD) disposed in a ground hub for high power amplifier (HPA) linearization, wherein the ground hub is arranged in a satellite communication (SATCOM) system together with a transmitter and a satellite transponder, and the satellite transponder includes an HPA, the PD comprising:
a processor; and
a memory, configured to store computer-executable instructions, wherein when the computer-executable instructions are executed, the processor is configured to:
determine an initial correction signal, including an amplitude modulation-to-amplitude modulation (AM-AM) correction signal and an amplitude modulation-to-phase modulation (AM-PM) correction signal, based on a physical model with a plurality of PD parameters, and send the initial correction signal to the transmitter to compensate AM-AM and AM-PM characteristics of the HPA; and
in respond to a PD controller taking an action to adjust the plurality of PD parameters, generate an updated correction signal, and send the updated correction signal to the transmitter to compensate the AM-AM and AM-PM characteristics of the HPA.

10. The PD according to claim 9, wherein:
the AM-AM characteristics of the HPA are fitted by $$\frac{\alpha_0 \rho_{y(t)}}{a_0 + \beta_0 (\rho_{y(t)} + b_0)^2},$$

where $\rho_{y(t)}$ is an amplitude of an input complex signal, and $a_0$, $b_0$, $\alpha_0$, and $\beta_0$ are four PD parameters of the plurality of PD parameters; and
the AM-PM characteristics of the HPA are fitted by $$\frac{\alpha_1 \rho_{y(t)}^2}{a_1 + \beta_1 (\rho_{y(t)} + b_1)^2},$$

where $a_1$, $b_1$, $\alpha_1$, and $\beta_1$ are four PD parameters of the plurality of PD parameters.

11. The PD according to claim 10, wherein:
a least-squares criterion is used to determine fits to the AM-AM and AM-PM characteristics of the HPA.

12. The PD according to claim 9, wherein:
the AM-AM correction signal is determined as $$\begin{cases} \frac{(\alpha_0 - 2b_0\beta_0\rho_{x(t)}) - \sqrt{\alpha_0^2 - 4\beta_0\rho_{x(t)}(a_0\rho_{x(t)} + b_0\alpha_0)}}{2\beta_0\rho_{x(t)}^2} & \rho_{x(t)} \le 1 \\ 1 & \rho_{x(t)} > 1 \end{cases};$$

and
the AM-PM correction signal is determined as $$-\frac{\alpha_1 \rho_{y(t)}^2}{a_1 + \beta_1 (\rho_{y(t)} + b_1)^2}.$$

13. A predistorter (PD) controller arranged in a ground hub, wherein the ground hub further includes a PD and is arranged in a satellite communication (SATCOM) system together with a transmitter and a satellite transponder, the satellite transponder includes a high power amplifier (HPA), and the PD controller receives a signal from the satellite transponder, the PD controller comprising:
a processor;
a memory, configured to store computer-executable instructions; and
a data storage, configured to store a database including a set of environmental parameters and a set of PD parameters corresponding to the set of environmental parameters, wherein when the processor executes the computer-executable instructions, the PD controller is configured to:

determine a reward function for an action taken by the PD controller based on the received signal and environmental parameters;

examine an action-value function for actions taken in a preset past period based on reward functions of the actions;

take an action, based on the environment parameters and the action-value function, to adjust a plurality of PD parameters for the PD to generate an updated correction signal; and update the database, including the set of environmental parameters and the set of PD parameters, in a real-time manner according to the environment parameters, the plurality of PD parameters, and the action-value function.

14. The PD controller according to claim 13, wherein:
the environmental parameters are observable external factors, including equipment imperfections, temperature variation, and interference signals.

15. The PD controller according to claim 13, wherein:

when the PD controller takes the action to adjust the plurality of PD parameters for the PD to generate the updated correction signal, an output power and an output phase for the HPA are estimated, wherein:

the reward function is defined as a distance between estimated and measured output power and phase of the HPA.

16. The PD controller according to claim 13, wherein:

when the PD controller examines the action-value function for actions taken in the preset past period based on reward functions of the actions, for every two consecutive actions, a discount factor is used to reduce a weight of the reward function corresponding to a former action between the two consecutive actions.

* * * * *